(12) United States Patent
Park et al.

(10) Patent No.: US 8,971,110 B2
(45) Date of Patent: Mar. 3, 2015

(54) NONVOLATILE MEMORY DEVICE AND PROGRAMMING METHOD OF THE SAME

(75) Inventors: Sang-Soo Park, Hwaseong-si (KR); Jae-Yong Jeong, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 409 days.

(21) Appl. No.: 13/533,999

(22) Filed: Jun. 27, 2012

(65) Prior Publication Data

US 2013/0094292 A1 Apr. 18, 2013

(30) Foreign Application Priority Data

Oct. 18, 2011 (KR) .................. 10-2011-0106636

(51) Int. Cl.
| | |
|---|---|
| G11C 11/34 | (2006.01) |
| G11C 16/04 | (2006.01) |
| G11C 11/56 | (2006.01) |
| G11C 16/10 | (2006.01) |
| G11C 16/34 | (2006.01) |

(52) U.S. Cl.
CPC ........ *G11C 11/5628* (2013.01); *G11C 16/0483* (2013.01); *G11C 16/10* (2013.01); *G11C 16/3454* (2013.01)
USPC ............ 365/185.03; 365/185.18; 365/185.22; 365/185.29

(58) Field of Classification Search
CPC ........... G11C 11/5628; G11C 16/3454; G11C 16/0483; G11C 16/12; G11C 8/08; G11C 16/04; G11C 16/10; G11C 16/32; G11C 11/5621; G11C 11/5635; G11C 16/102
USPC ............ 365/185.03, 185.26, 185.17, 185.18, 365/185.19, 185.22, 185.27, 185.29
See application file for complete search history.

(56) References Cited

U.S. PATENT DOCUMENTS

| | | | |
|---|---|---|---|
| 7,489,549 B2* | 2/2009 | Mokhlesi | 365/185.18 |
| 7,535,766 B2* | 5/2009 | Ito | 365/185.22 |
| 8,472,245 B2* | 6/2013 | Kim | 365/185.03 |
| 8,537,612 B2* | 9/2013 | Kang | 365/185.03 |
| 2003/0214852 A1* | 11/2003 | Chang | 365/200 |
| 2009/0290426 A1* | 11/2009 | Moschiano et al. | 365/185.22 |

FOREIGN PATENT DOCUMENTS

| | | |
|---|---|---|
| JP | 2009-301679 | 12/2009 |
| KR | 20090048763 | 5/2009 |
| KR | 20090092099 A | 8/2009 |

\* cited by examiner

*Primary Examiner* — Hien Nguyen
(74) *Attorney, Agent, or Firm* — Volentine & Whitt, PLLC

(57) ABSTRACT

A method is provided for programming a multi-level cell flash memory device. The programming method includes programming a first memory cell of the multi-level call flash memory device to one of first through i-th program states, wherein i is a positive integer, by applying a first program pulse to the first memory cell in a first type programming operation, and programming a second memory cell to one of i+1-th through j-th program states, wherein j is an integer equal to or greater than three, by applying a second program pulse to the second memory cell in a second type programming operation. At least one of a second step voltage, a second bit-line forcing voltage and a second verification operation of the second type programming operation is different from a first step voltage, a first bit-line forcing voltage, and a first verification operation of the first type programming operation, respectively.

20 Claims, 14 Drawing Sheets

NONVOLATILE MEMORY DEVICE AND PROGRAMMING METHOD OF THE SAME

CROSS-REFERENCE TO RELATED APPLICATIONS

A claim of priority under 35 U.S.C. §119 is made to Korean Patent Application No. 10-2011-0106636, filed on Oct. 18, 2011, in the Korean Intellectual Property Office, the entire contents of which are hereby incorporated by reference.

BACKGROUND

According to requirements for high capacity and high integration, flash memory devices program multiple bits in each memory cell, which reduces margins between program states. The reduced margins cause less reliability of the flash memory devices.

SUMMARY

The inventive concept provides a nonvolatile memory device having improved reliability and a programming method of the same.

According to an aspect of the inventive concept, there is provided a method of programming a multi-level cell flash memory device. The programming method includes programming a first memory cell of the multi-level call flash memory device to one of first through i-th program states, wherein i is a positive integer, by applying a first program pulse to the first memory cell in a first type programming operation, and programming a second memory cell to one of i+1-th through j-th program states, wherein j is an integer equal to or greater than three, by applying a second program pulse to the second memory cell in a second type programming operation. At least one of a second step voltage, a second bit-line forcing voltage and a second verification operation of the second type programming operation is different from a first step voltage, a first bit-line forcing voltage, and a first verification operation of the first type programming operation, respectively.

The first program pulse and the second program pulse may be applied in multiple program loops. The first type programming operation may include sequentially increasing the first program pulse by the first step voltage in the program loops, and the second type programming operation may include sequentially increasing the second program pulse by the second step voltage, different from the first step voltage, in the program loops.

When j is equal to three, the first program pulse may be for programming the first memory cell to a first program state, and the second program pulse may be for programming the second memory cell to a second program state or a third program state. When the first step voltage is smaller than the second step voltage, a width of distribution of the first program state is narrower than a width of distribution of the second program state or the third program state. When the second step voltage is smaller than the first step voltage, a width of distribution of the first program state is wider than a width of distribution of the second program state or a maximum threshold voltage and a width of distribution of the third program state.

Also, when j is equal to three, the first program pulse may be for programming the first memory cell to a first program state or a second program state, and the second program pulse may be for programming the second memory cell to a third program state. When the first step voltage is smaller than the second step voltage, a width of distribution of the first program state or the second program state is narrower than a width of distribution of the third program state. When the second step voltage is smaller than the first step voltage, a width of distribution of the first program state or the second program state is wider than a width of distribution of the third program state.

The first type programming operation may include applying a first bit-line forcing voltage to a bit line connected to the first memory cell to be programmed by the first program pulse. The second type programming operation may include applying a second bit-line forcing voltage, different from the first bit-line forcing voltage, to a bit line connected to the second memory cell to be programmed by the second program pulse.

When j is equal to three, the first program pulse may be for programming the first memory cell to a first program state, the second program pulse may be for programming the second memory cell to a second program state or a third program state, and the first bit-line forcing voltage may be lower than the second bit-line forcing voltage. The second bit-line forcing voltage may be applied to all bit lines with respect to the second program state.

Also, when j is equal to three, the first program pulse may be for programming the first memory cell to a first program state or a second program state, the second program pulse may be for programming the second memory cell to a third program state, and the first bit-line forcing voltage may be higher than the second bit-line forcing voltage.

The first memory cell to be bit-line forced using two verification operations may be set with respect to a programming operation according to the first program pulse. The second memory cell to be bit-line forced using two verification operations may be set with respect to a programming operation according to the second program pulse. A difference between verification voltages used in the two verification operations with respect to the programming operation according to the first program pulse is different from a difference between verification voltages used in the two verification operations with respect to the programming operation according to the second program pulse. The verification voltages with respect to the first program pulse or the verification voltages with respect to the second program pulse may be changed based on a margin required between the program states.

According to another aspect of the inventive concept, there is provided a method of programming a multi-level cell flash memory device. The programming method includes programming multiple first memory cells to a first program state by applying a first program pulse to the first memory cells via a word line in a first type programming operation, and programming multiple second memory cells to one of a second memory state or a third memory state by applying a second program pulse to the second memory cells via the word line in a second type programming operation. A width of distribution of the first program state varies from at least one of widths of distribution of the second and third program states, according to the first and second type programming operations. The first memory cells may have least significant bits in an erase state, and the second memory cells have least significant bits in a program state, for example.

According to another aspect of the inventive concept, a semiconductor memory system includes a memory controller and a flash memory device having multiple multi-level memory cells connected to a word line. The memory controller is configured to control storage of data in the multi-level memory cells by applying a first program pulse to at least one first memory cell of the multi-level memory cells in a first type programming operation for programming the at least one first memory cell to a first program state, and by applying a second program pulse to at least one second memory cell of the multi-level memory cells in a second type programming operation for programming the at least one second memory cell to one of a second program state or a third program state. At least one of a second step voltage, a second bit-line forcing voltage and a second verification operation of the second type programming operation is different from a first step voltage, a first bit-line forcing voltage, and a first verification operation of the first type programming operation, respectively.

BRIEF DESCRIPTION OF THE DRAWINGS

Exemplary embodiments will be more clearly understood from the following detailed description taken in conjunction with the accompanying drawings, in which.

DETAILED DESCRIPTION OF THE EMBODIMENTS

Figure 1:
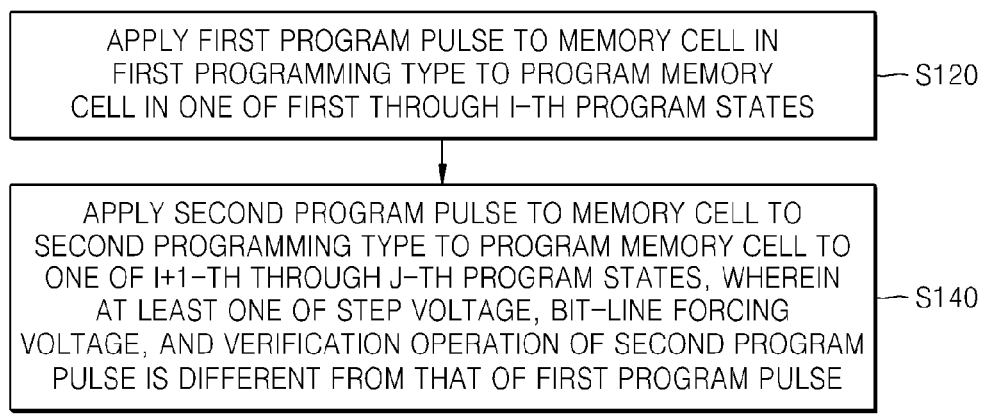
FIG. 1 is a flowchart illustrating a programming method of a nonvolatile memory device, according to an embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. In the drawings, the thicknesses of layers and regions are exaggerated for clarity. Unless otherwise noted, like reference numerals denote like elements throughout the attached drawings and written description, and thus descriptions will not be repeated.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Embodiments of the inventive concept are described herein with reference to cross-section illustrations that are schematic illustrations of idealized embodiments (and intermediate structures) of the inventive concept. As such, variations from the shapes of the illustrations as a result, for example, of manufacturing techniques and/or tolerances, are to be expected. Thus, embodiments of the inventive concept should not be construed as limited to the particular shapes of regions illustrated herein but are to include deviations in shapes that result, for example, from manufacturing. Expressions such as "at least one of" when preceding a list of elements, modify the entire list of elements and do not modify the individual elements of the list.

Figure 2:
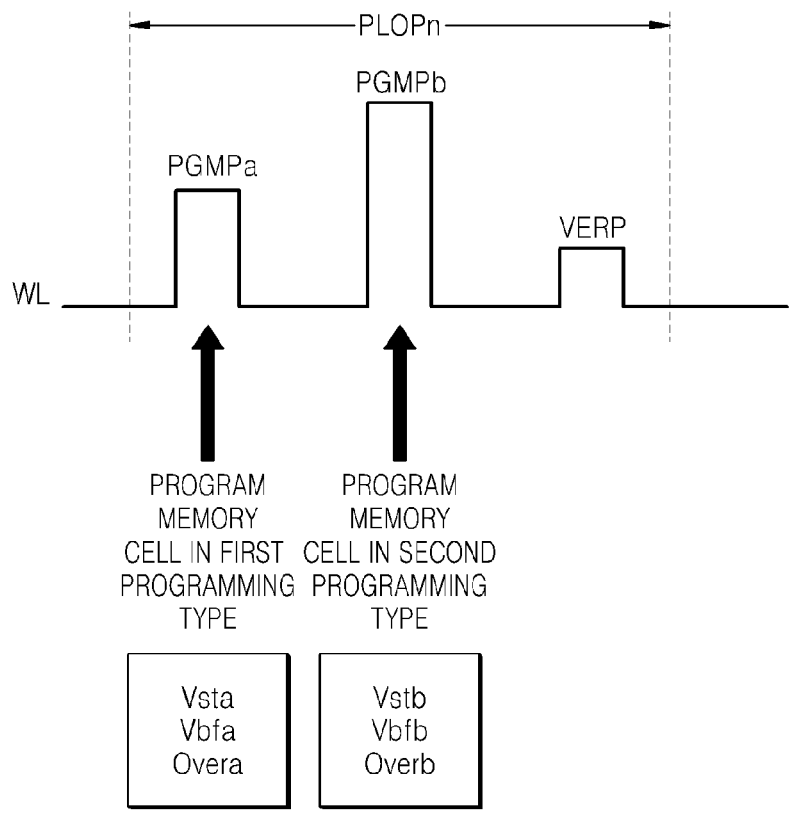
FIG. 2 is a conceptual diagram illustrating the programming method of FIG. 1, according to an embodiment of the inventive concept.

FIG. 1 is a flowchart illustrating a programming method of a nonvolatile memory device, according to an embodiment of the inventive concept, and FIG. 2 is a conceptual diagram illustrating the programming method of FIG. 1, according to an embodiment of the inventive concept.

Referring to FIGS. 1 and 2, the programming method according to the depicted illustrative embodiment includes applying a first program pulse PGMPa to a memory cell in a first type programming operation to program the memory cell to one of first through i-th program states (S120), and applying a second program pulse PGMPb to a memory cell in a second type programming operation to program the memory cell to one of i+1-th through j-th program states (S140). In this regard, in the first type programming operation and the second type programming operation, at least one of first and second step voltages Vsta and Vstb, first and second bit-line forcing voltages Vbfa and Vbfb, and first and second verification operations Overa and Overb may be different. For example, the first step voltage Vsta of the first program pulse PGMPa may be different from the second step voltage Vstb of the second program pulse PGMPb, the first bit-line forcing voltage Vbfa of the first program pulse PGMPa may be different from the second bit-line forcing voltage Vbfb of the second program pulse PGMPb, and/or the first verification operation Overa with respect to a programming operation of the first program pulse PGMPa may be different from the second verification operation Overb with respect to a programming operation of the second program pulse PGMPb, which will be described below in detail.

The programming method of the nonvolatile memory device, according to the depicted embodiment, may be performed on a nonvolatile memory device in a NAND flash memory device (not shown). Each memory cell in the NAND flash memory device is programmed or inhibited according to a voltage applied to a word line and a bit line. In addition, in order to program data in a certain memory cell of the NAND flash memory device or read data from the certain memory cell, a voltage applied to another memory cell or another transistor in a string where the certain memory cell is disposed needs to be controlled at the same time, as would be apparent to one of ordinary skill in the art.

Figure 3A:
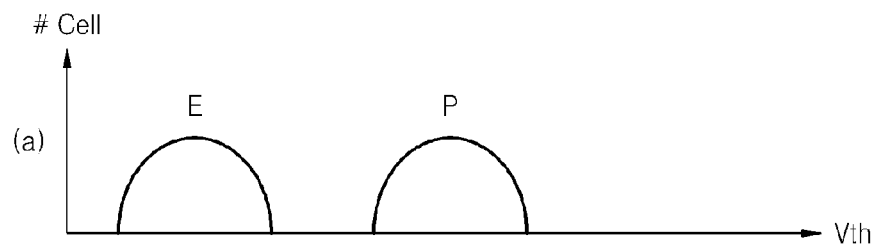
FIG. 3 is a graph showing cell distribution respectively in a single-level cell flash memory device and a multi-level cell flash memory device.

The NAND flash memory device may be a single-level cell flash memory device, where each memory cell has one of an erase state E and a program state P by programming one-bit data to each memory cell, as shown in FIG. 3($a$), for example. Alternatively, the NAND flash memory device may be a multi-level cell flash memory device that stores data of at least two bits in one memory cell. In this case, multiple program states exist, according to the size of data stored in each memory cell. For example, each memory cell of the NAND flash memory device capable of programming different k pieces of data (k being an integer equal to or greater than two) has one of the erase state E and j program states, where $j=2^k-1$. As shown in FIG. 3($b$), when each memory cell of the NAND flash memory device may be programmed to two-bit data, each memory cell may have one of the erase state E and three program states P1, P2 and P3. The erase state E shown in FIG. 3($b$) may have a value of 11, and the program states P1, P2 and P3 may have values of 10, 00, and 01, respectively, for example. However, the inventive concept is not limited thereto, and each state of FIG. 3($b$) may have another value of two bits.

Figure 4:
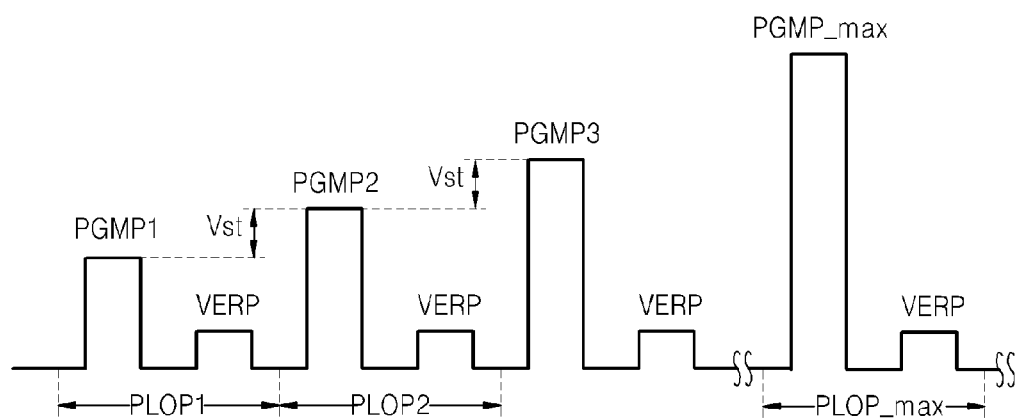
FIG. 4 is a graph for describing an incremental step pulse program (ISPP) method, according to an embodiment of the inventive concept.

The NAND flash memory device performs programming in page units, and as shown in FIG. 4, for example, multiple program loops PLOP1 through PLOP_max may be required to program all memory cells in one page, or an incremental step pulse program (ISPP) method of sequentially increasing voltages of program pulses PGMP1 through PGMP_max applied to a word line according to the program loops PLOP1 through PLOP_max may be used. FIG. 4 is a graph for describing an example of increasing a program pulse by a step voltage Vst according to program loops. Each program loop may include the program pulses PGMP1 through PGMP_max and a verification pulse VERP for verifying a state of a memory cell according to the corresponding program pulse. However, while programming one page, the programming ends regardless of a verification result when the program loop PLOP_max set to the maximum ends, and thus the program loop PLOP_max may not include a verification pulse.

FIG. 4 shows the program pulses PGMP1 through PGMP_max applied to the program loops PLOP1 through PLOP_max, respectively. Alternatively, multiple pulses may be included in each program loop. In FIGS. 1 and 2, for example, programming of multiple program states are performed using the first program pulse PGMPa and the second program pulse PGMPb according to the program loops, where FIG. 2 illustrates an arbitrary program loop PLOPn. However, in the programming method according to the current embodiment, when programming with respect to a program state corresponding to the first program pulse PGMPa or the second program pulse PGMPb in an arbitrary program loop, the corresponding program pulse is not applied from the next program loop, and thus, some program loops may only include the first program pulse PGMPa or the second program pulse PGMPb.

Referring back to FIGS. 1 and 2, at least one program state is programmed by each of the first program pulse PGMPa and the second program pulse PGMPb according to the programming method of the current embodiment. As described above, a memory cell is programmed to one program state of the first through i-th program states by the first program pulse PGMPa. Also, a memory cell is programmed to one program state of the i+1-th through j-th program states by the second program pulse PGMPb. It is understood that single memory cells are referenced herein for convenience of illustration, and that multiple memory cells may be programmed to one program state of the first through i-th program states by the first program pulse PGMPa, and that multiple memory cells may be programmed to each program state of the i+1-th through j-th program states by the second program pulse PGMPb.

For example, when the programming method of the current embodiment is a programming method in the two-bit multi-level cell flash memory device as shown in FIG. 3($b$), the first program pulse PGMPa may program a memory cell to a first program state P1, and the second program pulse PGMPb may program another memory cell to a second program state P2 or a third program state P3. Alternatively, when the programming method of the current embodiment is a programming method in the two-bit multi-level cell flash memory device as shown in FIG. 3($b$), the first program pulse PGMPa may program a memory cell to the first program state P1 or the second program state P2, and the second program pulse PGMPb may program a memory cell to the third program state P3.

In the programming method according to the current embodiment, a programming operation according to the first program pulse PGMPa and a programming operation according to the second program pulse PGMPb may be different. For convenience of description, the programming operation according to the first program pulse PGMPa will be referred to as a first type programming operation, and the programming operation according to the second program pulse PGMPb will be referred to as a second type programming operation. As described above, in the first type programming operation and the second type programming operation, and at least one of step voltages, bit-line forcing voltages, and verification operations may be different.

For example, a difference in voltage between program loops in an ISPP with respect to the first program pulse PGMPa may be a first step voltage Vsta, and a difference in voltage between program loops in an ISPP with respect to the second program pulse PGMPb may be a second step voltage Vstb, which is different from the first step voltage Vsta. Here, a step voltage may be a difference in voltage between program pulses in adjacent program loops. That is, the step voltage may be a magnitude of a voltage by which a program pulse sequentially increases in each program loop when the first program pulse PGMPa and the second program pulse PGMPb are applied to the multiple program loops as shown in FIG. 4.

Alternatively, in the programming method according to the current embodiment, the first bit-line forcing voltage Vbfa may be applied to a bit line connected to a memory cell to which the first program pulse PGMPa is applied, and the second bit-line forcing voltage Vbfb, which is different from the first bit-line forcing voltage Vbfa, may be applied to a bit line connected to a memory cell to which the second program pulse PGMPb is applied. Furthermore, in the programming method according to the current embodiment, the first verification operation Overa of the programming operation with respect to the first program pulse PGMPa may be performed p times (p being a positive integer) on every program loop to which the first program pulse PGMPa is applied, and the second verification operation Overb of the programming operation with respect to the second program pulse PGMPb may be performed q times (q being a positive integer other than p) on every program loop to which the second program pulse PGMPb is applied.

Figure 3B:
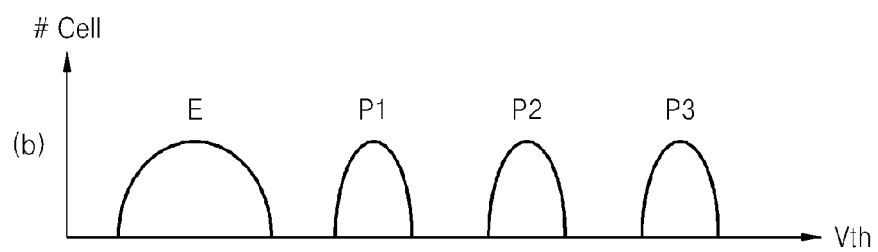

Hereinafter, a programming method used in a multi-level cell flash memory device in which each memory cell stores two-bit data as shown in FIG. 3(b), for example, according to an illustrative embodiment, will be described.

Figure 5:
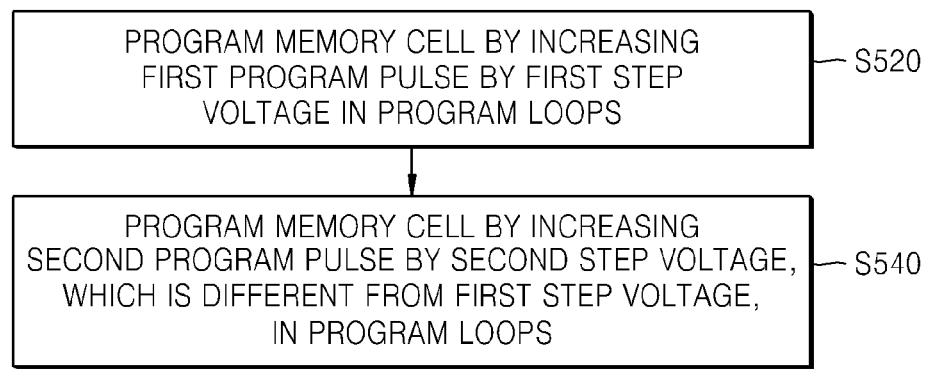
FIG. 5 is a flowchart illustrating a programming method used in a two-bit multi-level cell flash memory device when step voltages of a first type programming operation and a second type programming operation of FIG. 1 are different, according to an embodiment of the inventive concept.
Figure 6:
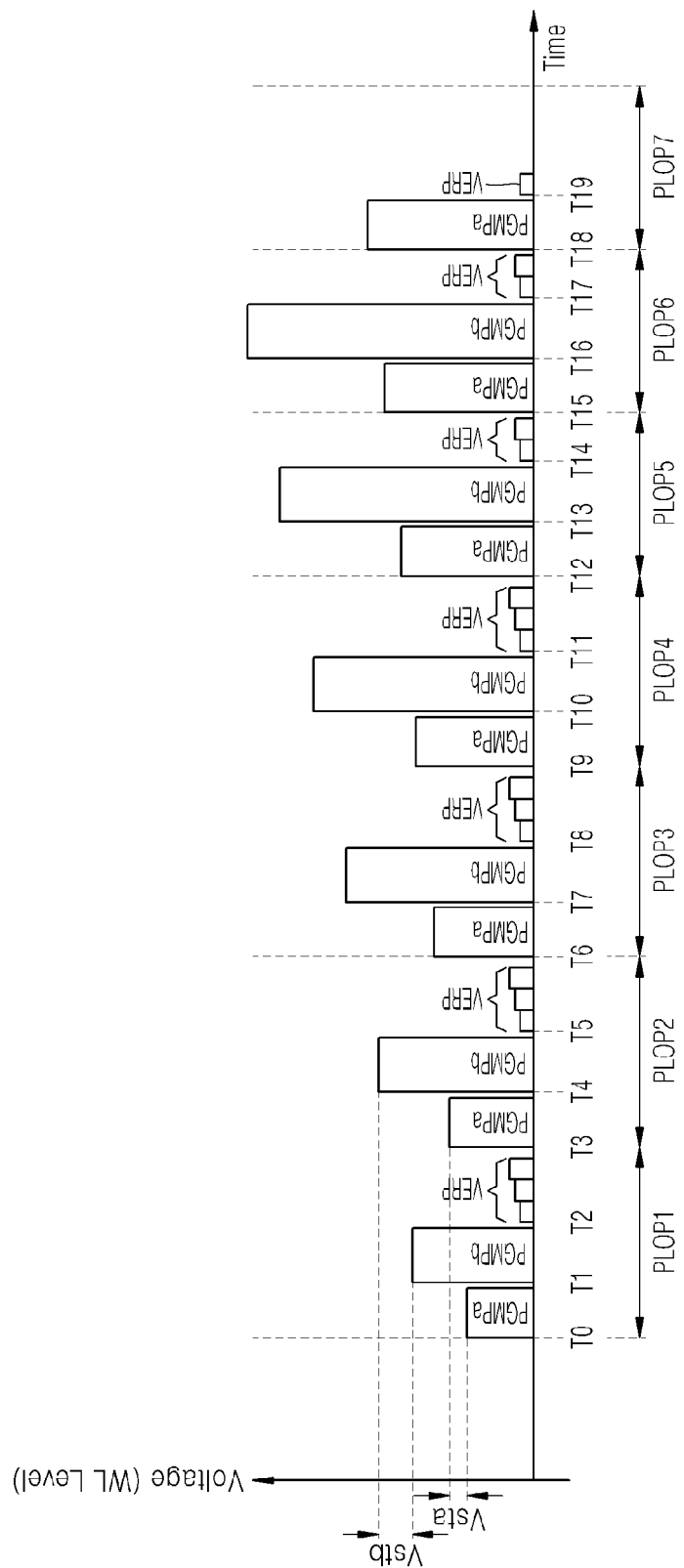
FIGS. 6 and 7 are graphs illustrating the programming method of FIG. 5, according to an embodiment of the inventive concept.
Figure 7:
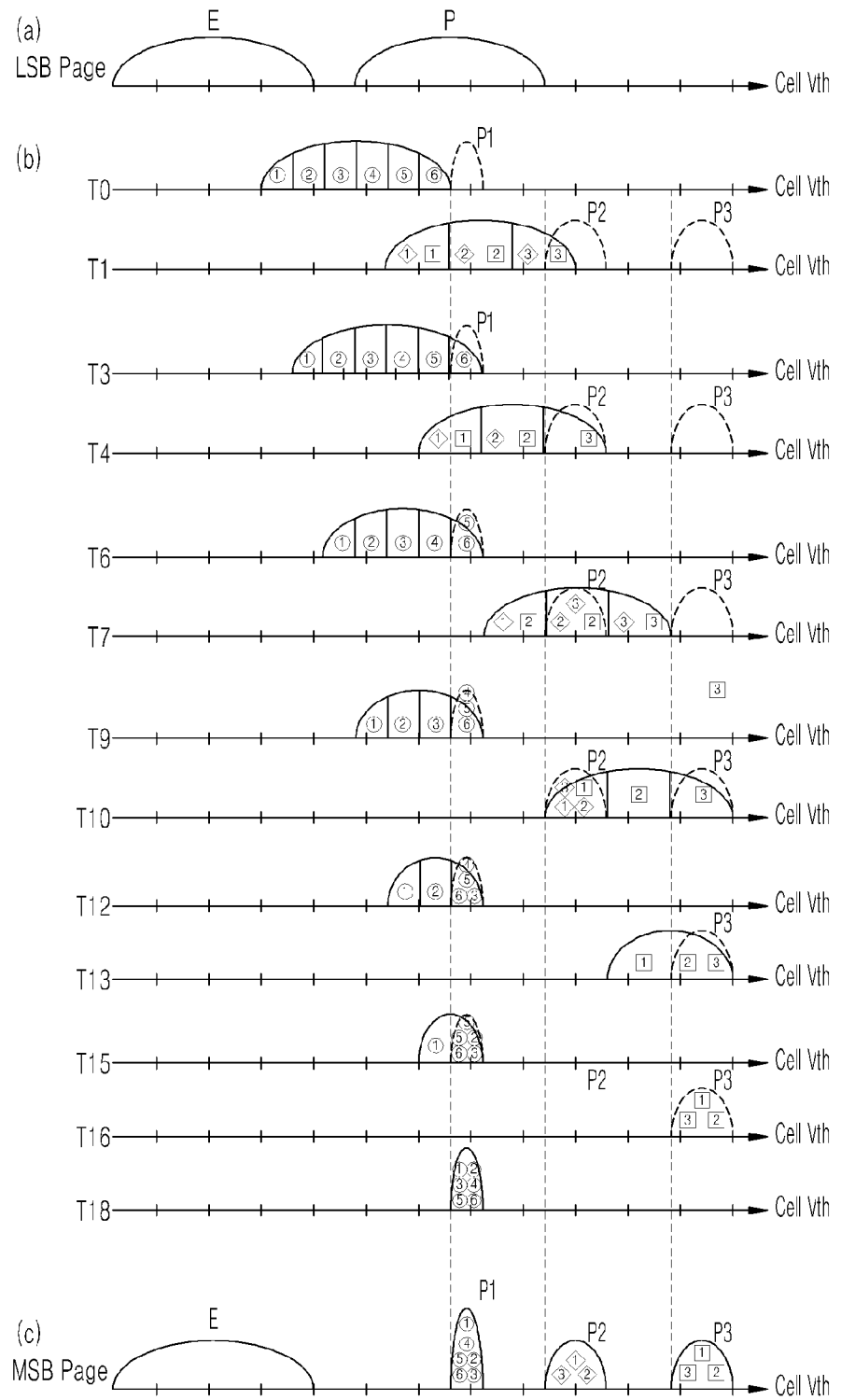

FIG. 5 is a flowchart illustrating a programming method used in a two-bit multi-level cell flash memory device when step voltages of the first type programming operation and the second type programming operation of FIG. 1 are different, according to an embodiment of the inventive concept. FIGS. 6 and 7 are graphs illustrating the programming method of FIG. 5, according to an embodiment of the inventive concept.

Referring to FIGS. 5 through 7, the first program pulse PGMPa is increased by the first step voltage Vsta in each of the first through seventh program loops PLOP1 through PLOP7 to which the first program pulse PGMPa is applied (S520). Also, the second program pulse PGMPb is increased by the second step voltage Vstb, which is different from the first step voltage Vsta, in each of the first through sixth program loops PLOP1 through PLOP6 to which the second program pulse PGMPb is applied (S540). The number of program loops shown in FIGS. 6 and 7 is an example, and may vary without departing from the scope of the present teachings.

In the programming method according to the current embodiment, in order to program two-bit data in a memory cell, the memory cell is programmed first to an LSB page having the erase state E or the program state P, as shown in FIG. 7(a). The memory cell is then programmed to an MSB page, as shown in FIG. 7(c), through a programming operation shown in FIG. 7(b) from the LSB page shown in FIG. 7(a). In particular, FIG. 7 illustrates an example of programming each memory cell in the erase state E of the LSB page (indicated by memory cells 1 through 6 in circles) to a first program state P1 using the first program pulse PGMPa, and programming each memory cell in the program state P of the LSB page to one of the second program state P2 (indicated by memory cells 1 through 3 in diamonds) or the third program state P3 (indicated by memory cells 1 through 3 in squares) of the MSB page using the second program pulse PGMPb.

FIGS. 6 and 7 illustrate an example in which the first step voltage Vsta is smaller than the second step voltage Vstb. That is, the first step voltage Vsta with respect to the first program pulse PGMPa is smaller than the second step voltage Vstb with respect to the second program pulse PGMPb. Accordingly, the number of program pulses applied varies when a memory cell is programmed to the first program state P1 of the MSB page from the erase state E of the LSB page using the first program pulse PGMPa, and when a memory cell is programmed to the second program state P2 or the third program state P3 of the MSB page from the program state P of the LSB page using the second program pulse PGMPb. That is, the number of first program pulses PGMPa applied to finish the programming operation with respect to the first program state P1 may be greater than the number of second program pulses PGMPb applied to finish the programming operation with respect to the second program state P2. Likewise, the number of first program pulses PGMPa applied to finish the programming operation with respect to the first program state P1 may be greater than the number of second program pulses PGMPb applied to finish the programming operation with respect to the third program state P3.

Accordingly, the width of distribution of the first program state P1 may be formed narrower than the width of distribution of the second program state P2 or the third program state P3. In this regard, the width of distribution denotes a value obtained by subtracting a minimum threshold voltage from a maximum threshold voltage of each program state.

The programming method of the current embodiment will be described in detail with reference to FIGS. 6 and 7. At time T0, the first program pulse PGMPa of the first program loop PLOP1 is applied, and thus, a threshold voltage of each memory cell in the erase state E of the LSB page is increased. Application of a program pulse means that the program pulse is applied to a word line to be programmed. Also, application of a program pulse means that the program pulse is applied to memory cells in which an inhibit voltage is not applied to a corresponding bit line, among multiple memory cells connected to the word line to be programmed.

Next, at time T1, a threshold voltage of each memory cell in the program state P of the LSB page is increased in response to application of the second program pulse PGMPb of the LSB page of the first program loop PLOP1.

Hereinafter, cell distribution changed by the first program pulse PGMPa of the first program loop PLOP1 will be referred to as an erase state changed in the first program loop PLOP1. Similarly, cell distribution changed by the first program pulse PGMPa of an arbitrary program loop will be referred to as an erase state changed in the arbitrary program loop. Similarly, cell distribution changed by the second program pulse PGMPb of the first program loop PLOP1 will be referred to as a program state changed in the first program loop PLOP1, and cell distribution changed by the second program pulse PGMPb of an arbitrary program loop will be referred to as a program state changed in the arbitrary program loop.

As described above, the first step voltage Vsta of the first program pulse PGMPa is smaller than the second step voltage Vstb of the second program pulse PGMPb, and the number of applications of the first program pulse PGMPa is more than the number of applications of the second program pulse PGMPb. In order to represent this conceptually, the number of states (magnitudes of threshold voltage) of a memory cell to be programmed from the erase state E (and the erase state changed in an arbitrary program loop) of the LSB page to which the first program pulse PGMPa is applied to the first program state P1 is more than the number of states of a memory cell to be programmed from the program state P (and the program state changed in an arbitrary program loop) of the LSB page to which the second program pulse PGMPb is applied to the second program state P2 and the third program state P3. In FIG. 7, in particular, the first through sixth memory cells 1 through 6 (in circles) to be programmed to the first program state P1 may be included in the erase state E (or a changed erase state) of the LSB page to which the first program pulse PGMPa is applied. Also, in FIG. 7, the first through third memory cells 1 through 3 (in diamonds) to be programmed to the second program state P2 may be included in the program state P (or a changed program state) of the LSB page to which the second program pulse PGMPb is applied. Similarly, in FIG. 7, the first through third memory cells 1 through 3 (in squares) to be programmed to the third program state P3 may be included in the program state P (or a changed program state) of the LSB page to which the second program pulse PGMPb is applied. Again, in order to indicate program states to program memory cells, the memory cells to be programmed to the first program state P1 are shown as memory cells 1 through 6 in numbered circles, the memory cells to be programmed to the second program state P2 are shown as memory cells 1 through 3 in numbered diamonds, and the memory cells to be programmed to the third program state P3 are shown as memory cells 1 through 3 numbered squares. Memory cells having an erase state in both the LSB and MSB pages are not shown.

Notably, each memory cell may not be a singular concept. That is, each memory cell may represent a set of memory cells, each having a predetermined threshold voltage of distribution. Also, embodiments of the inventive concept are not limited to the number of memory cells and/or states of the memory cell shown in FIG. 7. Also, as described above, FIG. 7 is a diagram conceptually illustrating that the first step voltage Vsta of the first program pulse PGMPa is smaller than the second step voltage Vstb of the second program pulse PGMPb, and thus, the number of first program pulses PGMPa to be applied to form the first program state P1 is more than the number of second program pulses PGMPb to be applied to form the second program state P2 or the third program state P3. Distribution with respect to each program state shown in FIG. 7 may include states of a number of memory cells different from the number of memory cells shown in FIG. 7.

Referring to FIGS. 6 and 7, at time T2, the state of each memory cell is verified according to application of the first program pulse PGMPa and the second program pulse PGMPb in the first program loop PLOP1. That is, it is verified whether the memory cells are programmed to desired program states by the first program pulse PGMPa and the second program pulse PGMPb in the first program loop PLOP1, respectively. For example, it is verified whether each memory cell to be programmed to the first program state P1 has the first program state P1 by the first program pulse PGMPa. Similarly, it is verified whether each memory cell to be programmed to the second program state P2 and the third program state P3 has the second program state P2 and the third program state P3, respectively, by the second program pulse PGMPb. Accordingly, the first program loop PLOP1 includes three verification pulses VERP having voltage levels corresponding to the first through third program states P1 through P3, respectively.

A verification operation is likewise performed in each program loop after the first program loop PLOP1 (e.g., second through seventh program loops PLOP2-PLOP7) in the same manner as described with respect to the first program loop PLOP1, and thus, detailed descriptions thereof will not be repeated. However, in fifth through seventh program loops PLOP5 through PLOP7, when a certain program state ends, a verification operation with respect to the corresponding program state is not performed, as described below in detail.

Referring to FIGS. 6 and 7, at time T3, a threshold voltage of each memory cell having an erase state changed in the first program loop PLOP1 is increased by the first program pulse PGMPa of the second program loop PLOP2. At time T4, a threshold voltage of each memory cell having a program state changed in the first program loop PLOP1 is increased by the second program pulse PGMPb of the second program loop PLOP2. Here, the sixth memory cell 6, which has the greatest threshold voltage among the first through sixth memory cells 1 through 6 having an erase state changed in the first program loop PLOP1, has a threshold voltage of the first program state P1 in response to the first program pulse PGMPa of the second program loop PLOP2. Also, the third memory cell 3 (in a diamond), which has the greatest threshold voltage among the first through third memory cells 1 through 3 having program states changed in the first program loop PLOP1 and to be programmed to the second program state P2, has a threshold voltage of the second program state P2 in response to the second program pulse PGMPb of the second program loop PLOP2. Accordingly, the bit line connected to the third memory cell 3, having a program state corresponding to the second program loop PLOP2, is inhibited, and thus programming with respect to the corresponding third memory cell 3 is no longer performed.

Hereinafter, it may be assumed that a memory cell programmed to a corresponding program state is not included in an erase state or a program state changed in the previous program loop. For example, it may be assumed that the sixth memory cell 6 having the first program state P1 and the third memory cell 3 having the second program state P2 in the second program loop PLOP2 are not included in an erase state and a program state that are changed in the second program loop PLOP2. This applies to program loops following the second program loop PLOP2.

At time T6, a threshold voltage of each memory cell having an erase state changed in the second program loop PLOP2 is increased by the first program pulse PGMPa of a third program loop PLOP3. At time T7, a threshold voltage of each memory cell having a program state changed in the second program loop PLOP2 is increased by the second program pulse PGMPb of the third program loop PLOP3. Here, a fifth memory cell 5, which has the greatest threshold voltage among the first through fifth memory cells 1 through 5 having an erase state changed in the second program loop PLOP2, has a threshold voltage of the first program state P1 in response to the first program pulse PGMPa of the third program loop PLOP3. Also, a second memory cell 2 (in a diamond), which has the greatest threshold voltage among the first and second memory cells 1 and 2 having a program state changed in the second program loop PLOP2 and to be programmed to the second program state P2, has a threshold voltage of the second program state P2 in response to the second program pulse PGMPb of the third program loop PLOP3. Accordingly, bit lines connected to the second and fifth memory cells 2 and 5 having program states corresponding to the third program loop PLOP3 are inhibited, and thus respective programming with respect to the corresponding second and fifth memory cells 2 and 5 is no longer performed.

The same operations as performed at times T6 and T7 are performed at times T9 and T10 during a fourth program loop PLOP4. Consequently, among the first through sixth memory cells 1 through 6 to be programmed to the first program state P1, each of the fourth through sixth memory cells 4 through 6 have the first program state P1 according to a programming operation performed in the fourth program loop PLOP4. Also, the first through third memory cells 1 through 3 have the second program state P2, and the programming operation with respect to the second program state P2 ends. The third memory cell 3 (in a square) among the first through third memory cells 1 through 3 to be programmed to the third program state P3 has the third program state P3.

Since the programming operation with respect to the second program state P2 has ended in the fourth program loop PLOP4, a programming operation and a verification operation are not performed with respect to the second program state P2 from the fifth program loop PLOP5 onward. The first program pulse PGMPa and the second program pulse PGMPb of the fifth program loop PLOP5 are applied at times T11 and T12, respectively. Consequently, among the first through sixth memory cells 1 through 6 to be programmed to the first program state P1, the third through sixth memory cells 3 through 6 have the first program state P1, and among the first through third memory cells 1 through 3 to be programmed to the third program state P3, the second and third memory cells 2 and 3 have the third program state P3.

The first program pulse PGMPa and the second program pulse PGMPb of the sixth program loop PLOP6 are applied at times T15 and T16, respectively. Consequently, among the first through sixth memory cells 1 through 6 to be programmed to the first program state P1, the second through sixth memory cells 2 through 6 have the first program state P1. Also, the first through third memory cells 1 through 3 have the third program state P3, and the programming operation with respect to the third program state P3 ends. Since the programming operation with respect to the third program state P3 has ended in the sixth program loop PLOP6, a programming operation and a verification operation are not performed with respect to the third program state P3 from the seventh program loop PLOP7 onward.

In other words, since the programming operations with respect to the second program state P2 and the third program state P3 have ended, the second program pulse PGMPb applied to the word line to program the second and third program states P2 and P3 is not applied after the sixth program loop PLOP6. Accordingly, in the seventh program loop PLOP7, the first program pulse PGMPa is applied at time T18, and only verification with respect to the first program pulse PGMPa is performed at time T19. The programming operation for programming the memory cell to the first program state P1 ends by the first program pulse PGMPa of the seventh program loop PLOP7 at time T18. The cell distribution after the programming operations for the first through third program states P1 through P3 end is shown in FIG. 7(c).

Figure 8:
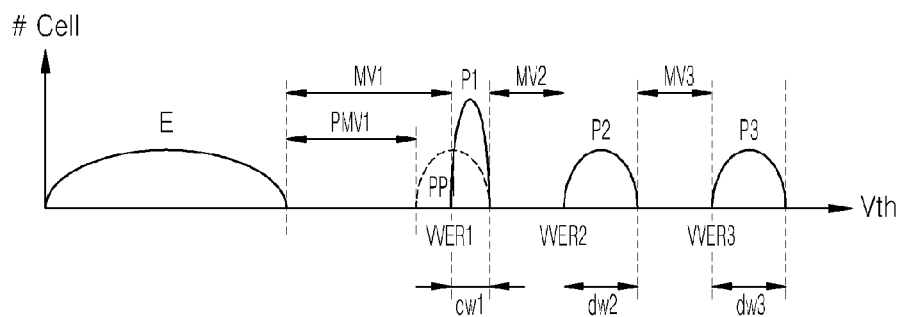
FIGS. 8 through 10 are diagrams illustrating the programming method of FIG. 5, according to embodiments of the inventive concept.

Referring to FIG. 8, showing a programming operation of an embodiment of the inventive concept, the programming operation is performed by varying step voltages of program pulses, e.g., as shown in FIG. 7(b), enabling margins between distributions to be differently set. In FIG. 8, in particular, a first width dw1 of distribution of the first program state P1 may be set differently than a second width dw2 of distribution of the second program state P2 and a third width dw3 of distribution of the third program state P3 by varying step voltages of program pulses, as shown in FIG. 7(c). Accordingly, only a first read margin MV1 between the erase state E and the first program state P1 is set differently from a first read margin PMV1 between the erase state E and a reference distribution PP1 with respect to the first program state P1. That is, a second read margin MV2 between the first program state P1 and the second program state P2 and a third read margin MV3 between the second program state P2 and the third program state P3 are the same as corresponding reference distributions (e.g., FIG. 3(b)). By differently setting magnitudes of step voltages of program pulses in a multi-pulse program, widths of distributions formed may vary. Accordingly, a margin between distributions of program states may be differently set according to specifications required in a memory device.

In FIG. 8, as programming time is extended, e.g., due to high integration and high capacity of a memory device, a change in threshold voltage of a memory cell in the erase state E is greater than that of another program state, and thus the memory device may be adaptively used in an apparatus using a margin between the erase state E and the first program state P1 as an issue. Here, if distributions of all program states are shifted to secure a read margin between the erase state E and the first program state P1, when a maximum threshold voltage of a memory cell that is allowable for a memory device is determined, the read margin may not be sufficiently secured.

Figure 9:
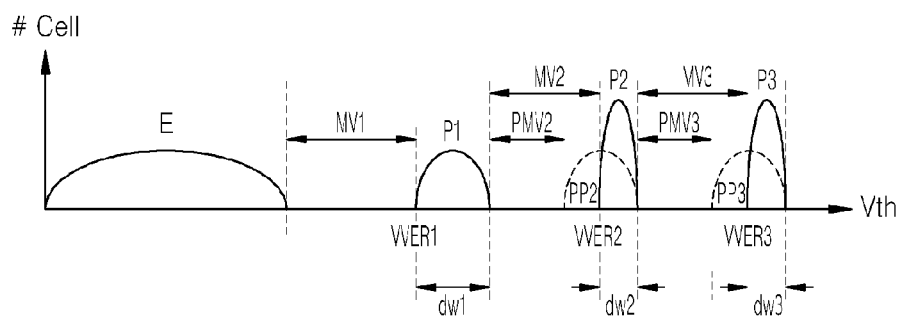
Figure 10:
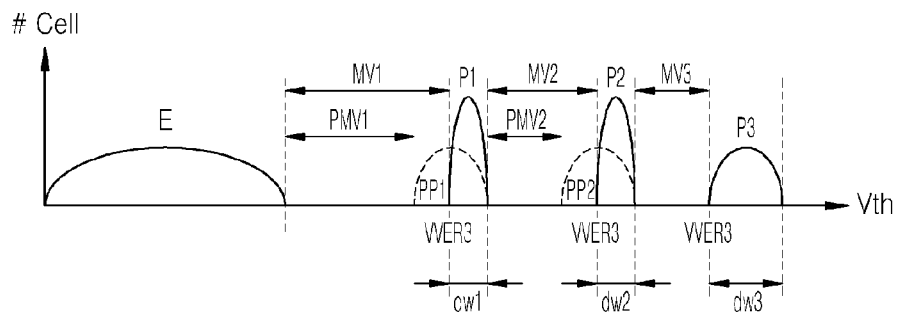

FIGS. 9 and 10 are diagrams illustrating cell distributions according to programming operations in a two-bit multi-level cell flash memory device, according to embodiments of the inventive concept.

Referring to FIG. 9, a programming operation such as that shown in FIG. 7(b) is performed by setting a second step voltage Vstb of the second program pulse PGMPb corresponding to the second program state P2 and the third program state P3 to be smaller than a first step voltage Vsta of the first program pulse PGMPa corresponding to the first program state P1. Accordingly, second and third widths dw2 and dw3 of distributions of second and third program states P2 and P3, respectively, are formed differently than corresponding reference distributions PP2 and PP3 with respect to the second and third program states P2 and P3. This is different from the programming operation shown in FIG. 7(b), where the first step voltage Vsta of the first program pulse PGMPa corresponding to the first program state P1 is set to be smaller than the second step voltage Vstb of the second program pulse PGMPb corresponding to the second and third program states P2 and P3, resulting in the first width dw1 of distribution of the first program state P1 being differently set, as described with reference to FIG. 8. That is, in the programming method of the current embodiment, a program state to adjust the widths of distribution by setting a relative magnitude between step voltages of program pulses may be selected.

A read margin of the program state having a changed width of distribution is changed and the adjacent program state is increased. For example, referring to FIG. 9, a second read margin MV2, between the second program state P2 in which the width of distribution is changed and the first program state P1, is greater than a second read margin PMV2 with respect to reference distribution PP2. Similarly, a third read margin MV3, between the third program state P3 and the second program state P2, in each of which the width of distribution is changed, is greater than a third read margin PMV3 with respect to reference distributions PP3 (and PP2).

Referring to FIG. 10, in a programming operation according to another embodiment, unlike the programming operations of FIGS. 8 and 9, a first program state P1 and a second program state P2 are programmed by a first program pulse PGMPa, and a third program state P3 is programmed by a second program pulse PGMPb. In this case, the programming operation shown in FIG. 7(b) may be performed by setting a first step voltage Vsta of the first program pulse PGMPa to be smaller than a second step voltage Vstb of the second program pulse PGMPb. Consequently, read margins MV1 and MV2 may be adjusted by differently setting the width of distribution with respect to the first and second program states P1 and P2 from reference distributions PP1 and PP2.

In the above description, examples of varying step voltages to vary programming operation for each program pulse among multiple program-pulses have been described. Next, a programming operation for varying a bit-line forcing voltage and a verification operation for each program pulse among multiple program-pulses will be described. In particular, as shown in FIG. 3(b), a programming operation used in a multi-level cell flash memory device in which two-bit data are stored in each memory cell, for example, the programming operation of the current embodiment will be described in detail.

Figure 11:
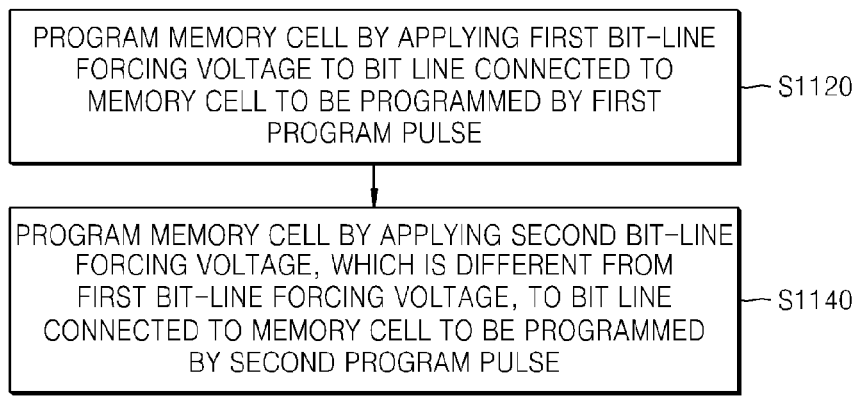
FIGS. 11 and 12 are diagrams illustrating a programming method, according to another embodiment of the inventive concept.
Figure 12:
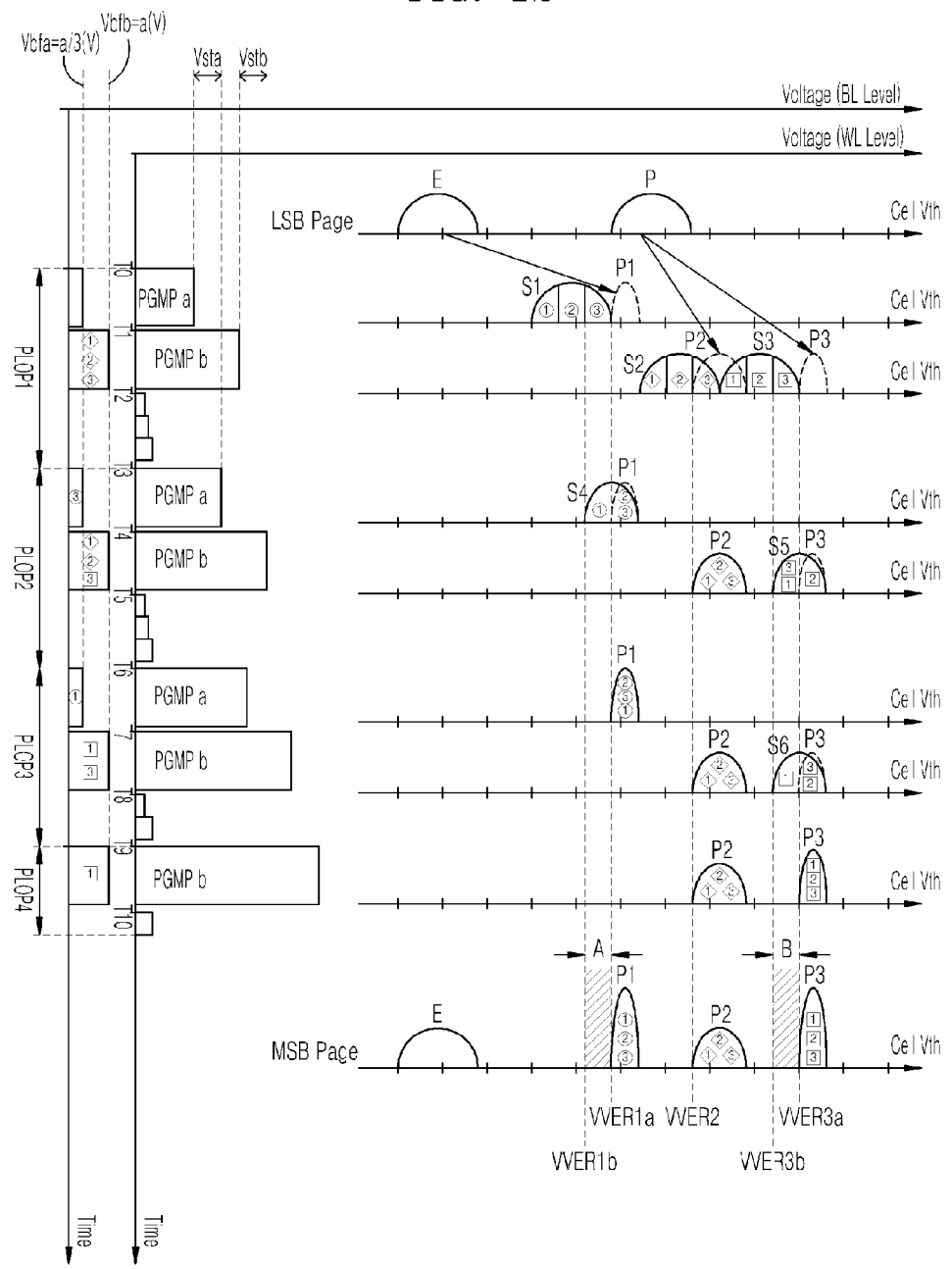

FIGS. 11 and 12 are diagrams illustrating a programming operation used in a two-bit multi-level cell flash memory device, in which bit-line forcing voltages of the first type programming operation and the second type programming operation of FIG. 1 are different, according to an embodiment of the inventive concept.

Referring to FIGS. 11 and 12, a first bit-line forcing voltage Vbfa is applied to a bit line connected to a memory cell to be programmed by a first program pulse PGMPa (S1120), and a second bit-line forcing voltage Vbfb is applied to a bit line connected to a memory cell to be programmed by a second program pulse PGMPb (S1140). Here, the first bit-line forcing voltage Vbfa and the second bit-line forcing voltage Vbfb are different. FIG. 12, in particular, illustrates an example in which the first bit-line forcing voltage Vbfa corresponding to the first program pulse PGMPa is smaller than the second bit-line forcing voltage Vbfb corresponding to the second program pulse PGMPb. For example, if a distribution width of one-shot is a V, the first bit-line forcing voltage Vbfa may be a/3 V (one third of a V) and the second bit-line forcing voltage Vbfb may be a V. Again, single memory cells are referenced herein for convenience of illustration, and thus the first bit-line forcing voltage Vbfa may be applied to multiple bit lines connected to multiple memory cells to be programmed by a first program pulse PGMPa, and the second bit-line forcing voltage Vbfb may be applied to multiple bit lines connected to multiple memory cells to be programmed by the second program pulse PGMPb.

FIG. 12 is a diagram illustrating an example in which a programming operation with respect to first through third program states P1 through P3 is completed via first through third program loops PLOP1 through PLOP3. At time T0, in order to form the first program state P1, the first program pulse PGMPa of the first program loop PLOP1 is applied, and thus, a threshold voltage Vth of each memory cell in an erase state E of an LSB page is increased. The first bit-line forcing voltage Vbfa is applied to bit lines connected to the memory cells to be programmed to the first program state P1.

At time T1, in order to form the second program state P2 and the third program state P3, the second program pulse PGMPb of the first program loop PLOP1 is applied, and thus, a threshold voltage of each memory cell in a program state P of the LSB page is increased. The second bit-line forcing voltage Vbfb, which is different from the first bit-line forcing voltage Vbfa, is applied to bit lines connected to the memory cells to be programmed to the second program state P2.

A degree to which the threshold voltage of each memory cell in the program state P of the LSB page is increased according to the second program pulse PGMPb is different from the degrees to which threshold voltages of the memory cells to be respectively programmed to the second and third program states P2 and P3 are increased. According to the programming method of the current embodiment, in order to form different program states by one program pulse as described above, bit-line forcing is performed with respect to a low program state among the different program states. In FIG. 12, among the second and third program states P2 and P3 that are simultaneously programmed by the second program pulse PGMPb, the second bit-line forcing voltage Vbfb is applied to all bit lines connected to memory cells to be programmed to the second program state P2. Accordingly, even when the same second program pulse PGMPb is applied, an increase in threshold voltage of each memory cell to be programmed to the second program state P2 is smaller than an increase in threshold voltage of each memory cell to be programmed to the third program state P3.

At time T2, a verification operation is performed with respect to the programming performed in the first program loop PLOP1. In order to verify the programming operation performed according to the first program pulse PGMPa at time T0, verification voltage VVER1a may be applied. A verification voltage VVER1b with respect to the first program pulse PGMPa may be applied again so that among memory cells programmed by the first program pulse PGMPa at time T0, e.g., first through third memory cells 1 through 3 of first distribution S1, the third memory cell 3 of the first distribution S1 having a threshold voltage between the verification voltage VVER1a and the verification voltage VVER1b is set to be bit-line forced in the next program loop.

As described above, the first through third memory cells 1 through 3 of the first distribution S1 are not singular concepts and represent multiple memory cells of the corresponding distribution section. As described above, when the width OSW of one-shot is a V, the first through third memory cells 1 through 3 of the first program state P1 may be memory cells having threshold voltages included in a section of a/3 V. This applies to first through third memory cells 1 through 3 of another distribution to be described below.

Second distribution S2 according to the second program pulse PGMPb at time T1 verifies using one verification voltage VVRE2. As described above, since all bit lines are forced with regard to the second distribution S2, it is unable to select a memory cell to be bit-line forced through a two-step verification, i.e., through two verification operations. Also, with regard to third distribution S3 according to the second program pulse PGMPb at time T1, a memory cell having a threshold voltage between the verification voltage VVER3a and the verification voltage VVER3b is set as a memory cell (the third memory cell 3 of the third program state P3) to be bit-line forced in the next program loop through a two-step verification, i.e., through two verification operations respectively according to a verification voltage VVER3a and a verification voltage VVER3b.

Here, a value A between the verification voltage VVER1a and the verification voltage VVER1b may be different from a value B between the verification voltage VVER3a and the verification voltage VVER3b. For example, when the first step voltage Vsta of the first program pulse PGMPa is different from the second step voltage Vstb of the second program pulse PGMPb, the value A between the verification voltage VVER1a and the verification voltage VVER1b may be different from the value B between the verification voltage VVER3a and the verification voltage VVER3b.

At time T3, the first program pulse PGMPa of the second program loop PLOP2 is applied, and thus, a threshold voltage of each memory cell included in the first distribution S1 is increased. For example, when the first step voltage Vsta of the first program pulse PGMPa is 2a/3 V, a threshold voltage of a memory cell is increased by 2a/3 V. However, a threshold voltage of the third memory cell 3 that is bit-line forced corresponds to a difference between the first program pulse PGMPa and the first bit-line forcing voltage Vbfa. For example, when the first program pulse PGMPa is 2a/3 V and the first bit-line forcing voltage Vbfa is a/3 V, the threshold voltage Vth of the third memory cell 3 may be increased by a/3 V. In the depicted example, among first through third memory cells 1 through 3 of fourth distribution S4, the second and third memory cells 2 and 3 have threshold voltages equal to or greater than the verification voltage VVER1a by the programming operation at time T3.

At time T4, the second program pulse PGMPb of the second program loop PLOP2 is applied, and thus, a threshold voltage of a memory cell included in the second distribution S2 is increased. For example, when the second step voltage Vstb of the second program pulse PGMPb is 2a/3 V, among the first through third memory cells 1 through 3 in the second program state P2, the first and second memory cells 1 and 2, which had threshold voltages lower than the verification voltage VVER2 at time T1, have threshold voltages higher than the verification voltage VVER2. Accordingly, a programming operation with respect to the second program state P2 may end.

For reference, an inhibit voltage is applied to a bit line connected to the third memory cell 3 of the second distribution S2 that is determined to have a threshold voltage higher than the verification voltage VVER2 by the programming operation performed in the first program loop PLOP1 according to the verification operation at time T2, and thus, the third memory cell 3 of the second distribution S2 is not affected by a programming operation performed after the second program loop PLOP2. This applies to the next lines connected to memory cells that are verified to be programmed to corresponding program states.

Referring again to FIG. 12, a change in the third program state P3 according to the second program pulse PGMPb of the second program loop PLOP2 at time T4 is similar to that in the first program state P1, and thus, a detailed description thereof will not be repeated. However, the second step voltage Vstb of the second program pulse PGMPb is the same as the bit-line forcing voltage Vbfb of the second program pulse PGMPb, and thus, a threshold voltage of the third memory cell 3 of the third distribution S3 is not changed by the second program pulse PGMPb of the second program loop PLOP2.

A verification operation at time T5 is similar to that at time T3. However, since the threshold voltages of memory cells of the second program loop PLOP2 have changed, each threshold voltage has a value between the verification voltage VVER1$a$ and the verification voltage VVER1$b$ or between the verification voltage VVER3$a$ and the verification voltage VVER3$b$, and thus, a memory cell to be bit-line forced in the next program loop is changed.

A programming operation that is performed with respect to the first program state P1 ends in the third program loop PLOP3 by the above-mentioned operation. Accordingly, the first program pulse PGMPa is not applied from the fourth program loop PLOP4, and a verification voltage with respect to a programming operation according to the first program pulse PGMPa is not applied. Also, in the third program loop PLOP3, the second and third memory cells 2 and 3 of sixth distribution S6 have a threshold voltage higher than the verification voltage VVER3$a$. Accordingly, the threshold voltage of the first memory cell 1 of the sixth distribution S6 bit-line forced in the fourth program loop PLOP4 at time T9 is increased by a/3 V, and thus, the first memory cell 1 has a threshold voltage higher than the verification voltage VVER3$a$, thereby finishing a programming operation with respect to the third program state P3.

According to the above-described programming operation, a margin between the erase state E and the first program state P1, a margin between the first program state P1 and the second program state P2, and a margin between the second program state P2 and the third program state P3 may be differently set. According to the programming method of the current embodiment, bit-line forcing voltages with respect to program pulses are differently set, and thus, a margin between the program pulses may be set to be adapted to a characteristic of a memory device. Also, the number of program loops (or program pulses) used in the programming operation may be reduced, thereby increasing programming speed and resource efficiency.

Figure 13:
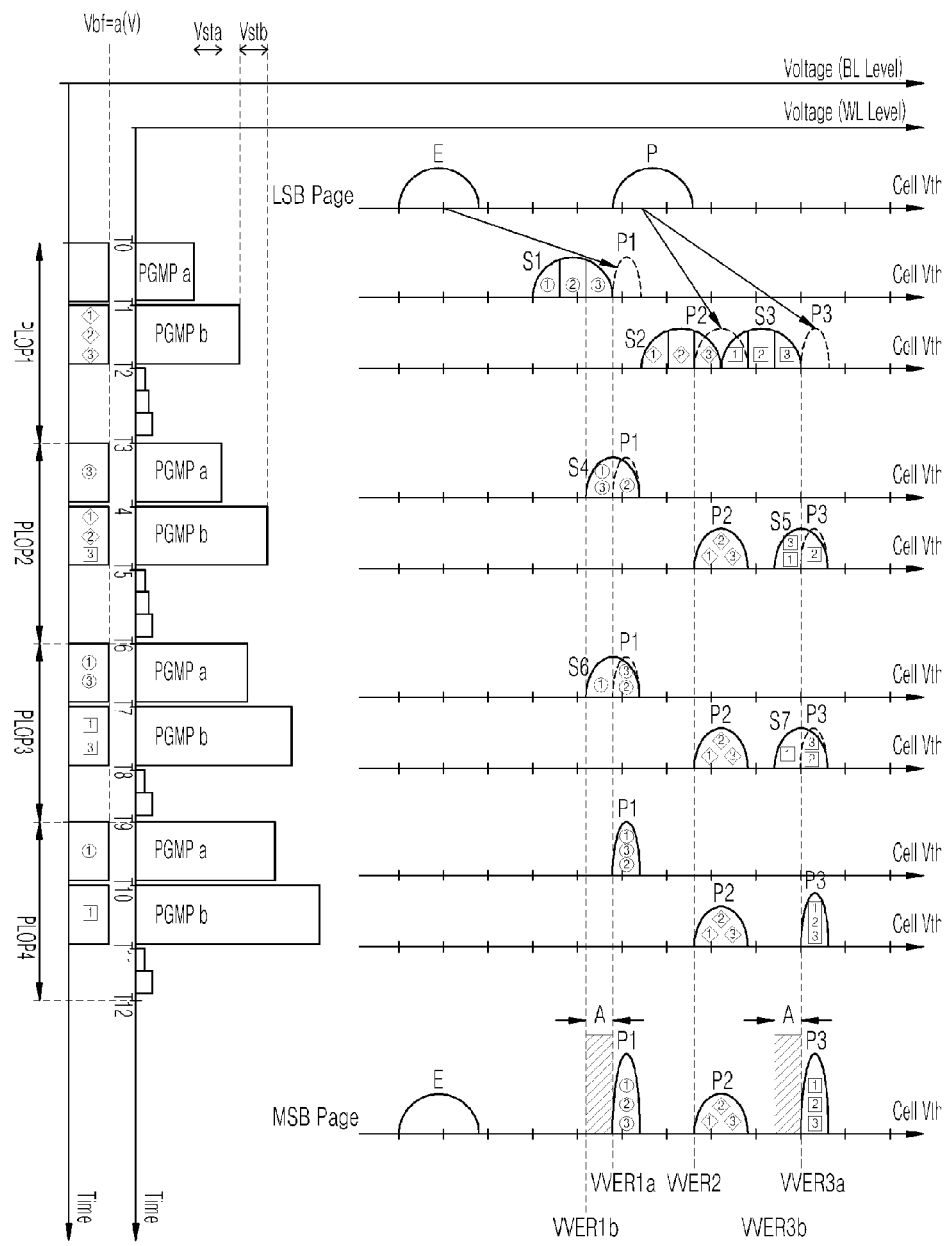
FIGS. 13, 14 and 15 are diagrams illustrating programming methods, according to embodiments of the inventive concept.

FIG. 13 is a diagram illustrating a programming operation performed when bit-line forcing voltages with respect to program pulses are the same, according to an embodiment of the inventive concept.

Referring to FIG. 13, second bit-line forcing voltage Vbfb is set higher than first bit-line forcing voltage Vbfa, e.g., Vbfb=a V>Vbfa=a/3 V, to secure a margin between a second program state P2 and a third program state P3 that are simultaneously programmed by the second program pulse PGMPb. Therefore, programming is delayed due to a first program pulse PGMPa. For example, in a third memory cell 3 of first distribution S1, a second step voltage Vstb of a second program pulse PGMPb and the second bit-line forcing voltage Vbfb of the second program pulse PGMPb have the same value, e.g., a V, and thus, a threshold voltage of the third memory cell 3 of the first distribution S1 is not changed due to the first program pulse PGMPa of the second program loop PLOP2. Accordingly, in order to finish a first program state P1 of FIG. 13, the first program pulse PGMPa needs to be applied four times, which is more than that in FIG. 12.

Figure 14:
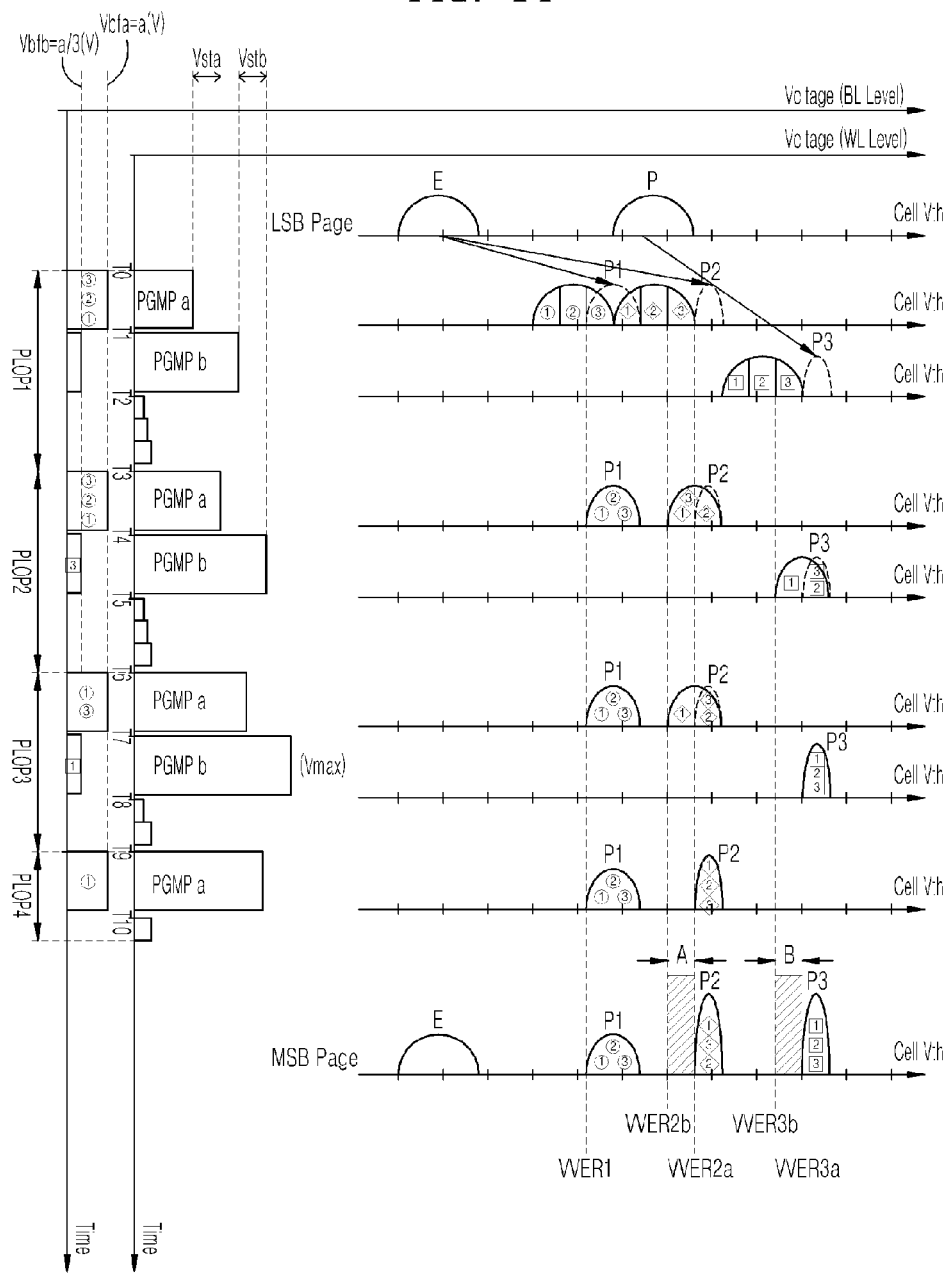

FIG. 14 is a diagram illustrating a programming method used in a two-bit multi-level cell flash memory device in which bit-line forcing voltages of the first and second type programming operations of FIG. 1 are different, according to another embodiment of the inventive concept.

Referring to FIG. 14, unlike the programming operation of FIG. 13, a first program state P1 and a second program state P2 are programmed by a first program pulse PGMPa, and a third program state P3 is programmed by a second program pulse PGMPb. Also, unlike the programming method of FIG. 13, a first bit-line forcing voltage Vbfa of the first program pulse PGMPa is greater than a second bit-line forcing voltage Vbfb of the second program pulse PGMPb. For example, in FIG. 14, the first bit-line forcing voltage Vbfa is a V, and the second bit-line forcing voltage Vbfb is a/3 V.

The principle of the programming operation of FIG. 14 is the same as that of FIG. 13, and thus, a detailed description thereof will not be repeated. Accordingly, in the programming method of the current embodiment, when all bit lines with respect to one program state are forced to maximize a performance of the memory device in programming two program states using one program pulse, a bit-line forcing voltage with respect to one program pulse for programming two program states may be set high to reduce a gap between the two program states programmed using the program pulse.

Figure 15:
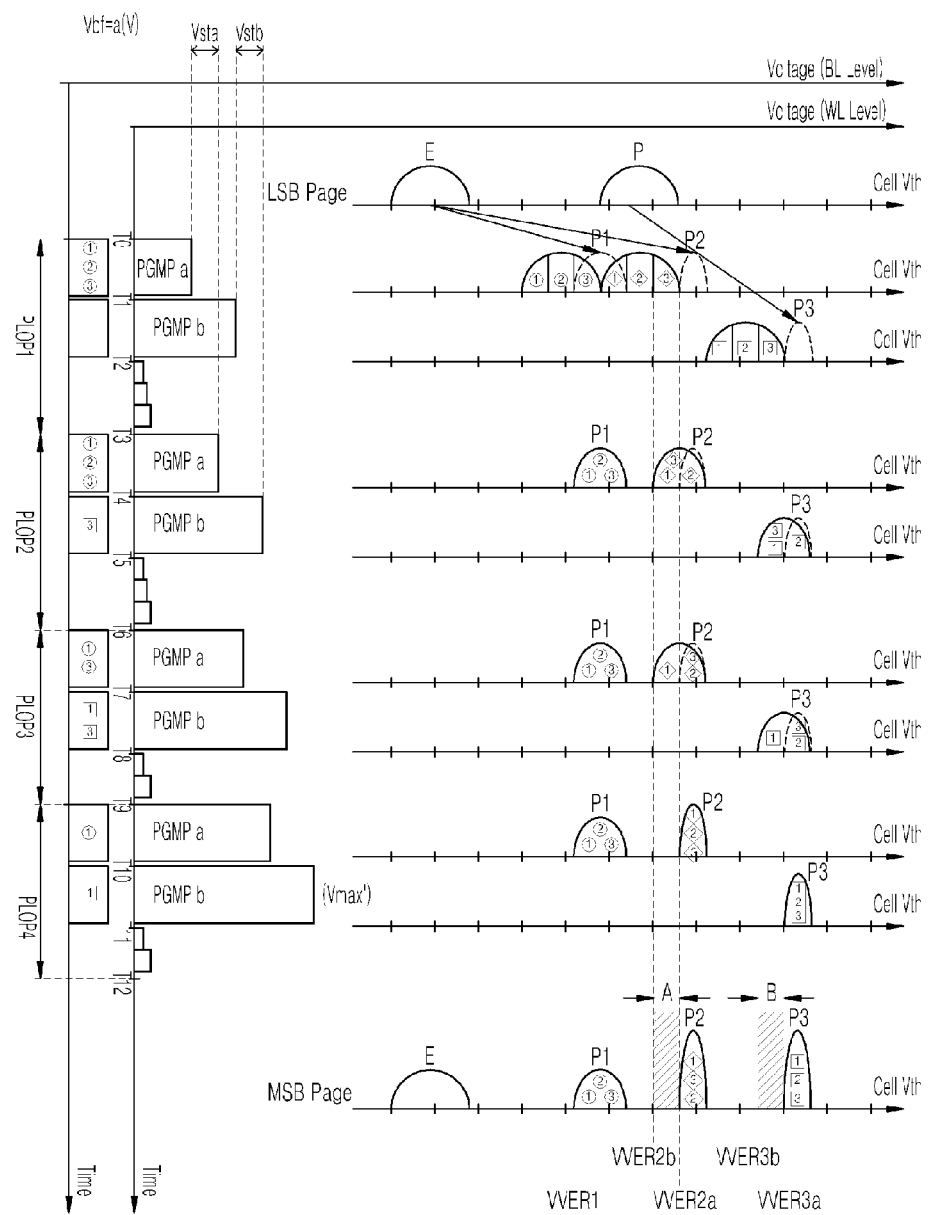

Accordingly, when the bit-line forcing voltage is set with respect to program pulses, the bit-line forcing voltage needs to be set with respect to the program pulse for programming two program states, thereby preventing a maximum programming voltage from being increased, which will be described with respect to FIG. 15. Thus, a maximum programming voltage Vmax of FIG. 14 is lower than a maximum programming voltage Vmax' of FIG. 15 in which the same bit-line forcing voltage is used in program pulses.

Also, since it is unnecessary to have a high bit-line forcing voltage of a program pulse for programming one program state, the number of program pulses to be applied may be reduced. In FIG. 14, the second program pulse PGMPb is applied three times to program the third program state P3. On the other hand, in FIG. 15 in which the same bit-line forcing voltage is used in program pulses, the second program pulse PGMPb is applied five times.

In the programming method of the current embodiment, the example of applying two program pulses in an arbitrary program loop has been described. However, the inventive concept is not limited thereto. In the programming operation of the current embodiment, three or more program pulses may be applied in an arbitrary program loop.

Figure 16:
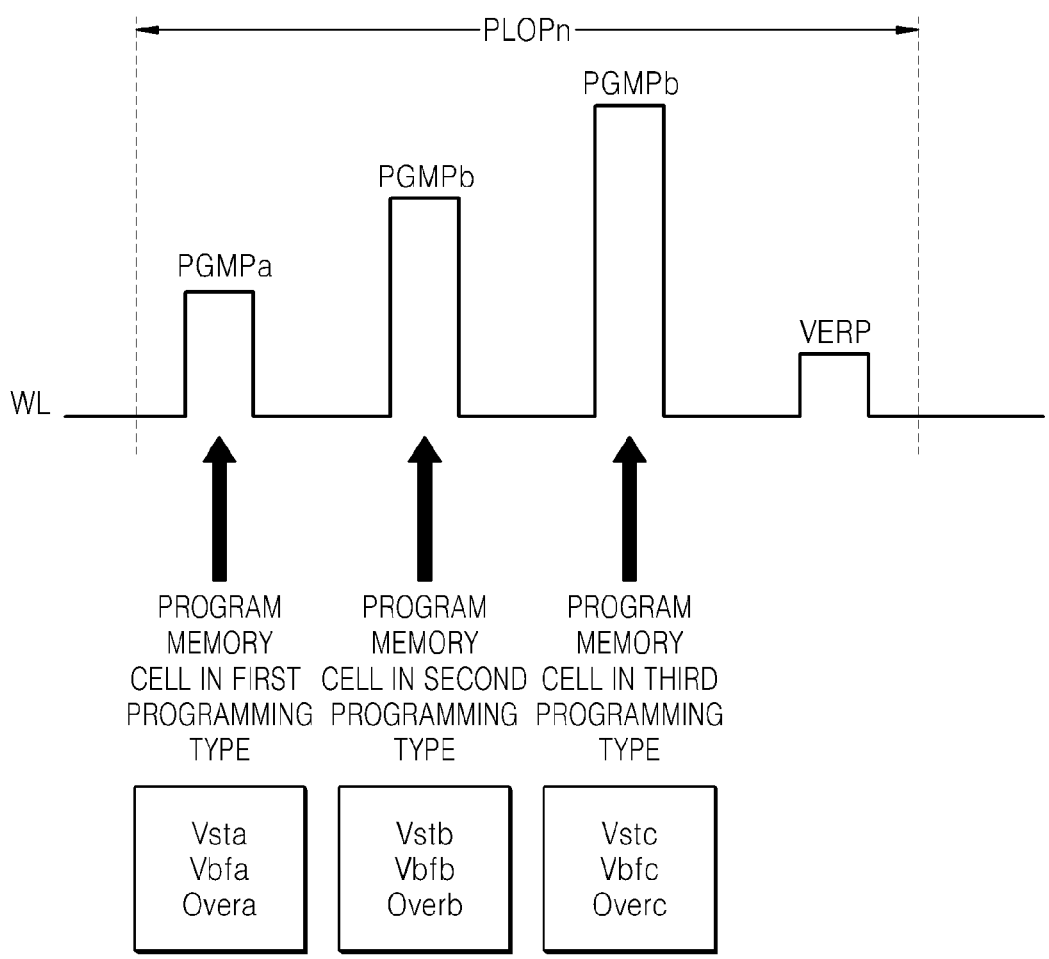
FIG. 16 is a diagram illustrating a programming method used in a three-bit multi-level cell flash memory device, according to an embodiment of the inventive concept.

FIG. 16 is a diagram illustrating a programming method in which three program pulses are applied in an arbitrary program loop, according to an embodiment of the inventive concept.

Referring to FIG. 16, a program loop PLOPn includes first through third program pulses PGMPa through PGMPc. The first program pulse PGMPa may be a program pulse for programming a memory cell to the first program state P1 of FIG. 3(b), the second program pulse PGMPb may be a program pulse for programming a memory cell to the second program state P2 of FIG. 3(b), and the third program pulse PGMPc may be a program pulse for programming a memory cell to the third program state P3 of FIG. 3(b).

The first program pulse PGMPa may be applied to a memory cell in a first type programming operation, and the second program pulse PGMPb may be applied to a memory cell in a second type programming operation. In the first type programming operation and the second type programming operation, at least one of first and second step voltages Vsta and Vstb, first and second bit-line forcing voltages Vbfa and Vbfb, and first and second verification operations Overa and Overb may be different. In addition, the third program pulse PGMPc may be applied to a memory cell in a third programming operation. In the third programming operation, at least one of a step voltage Vstc, a bit-line forcing voltage Vbfc, and a verification operation Overc may be different from those of the first type programming operation or the second type programming operation. However, the inventive concept is not limited thereto, and the third programming operation of the current embodiment may be the same as the first type programming operation or the second type programming operation.

In the above description, the programming operation in the two-bit multi-level cell flash memory device has been described, but a similar programming method may be performed to form at least seven program states in a multi-level cell flash memory device of at least three bits. For example, first through seventh program states may be programmed in a three-bit multi-level cell flash memory device by varying at least one of a step voltage, a bit-line forcing voltage, and a verification operation in multiple program pulses, as described in the programming method of the current embodiment.

However, in the above-described programming method, one or two program states are formed by each program pulse, whereas more program states need to be formed by each program pulse in the three-bit multi-level cell flash memory device of FIG. 16. For example, first and second program states are formed by the first program pulse PGMPa of FIG. 16, third and fourth program states are formed by the second program pulse PGMPb of FIG. 16, and fifth and sixth program states are formed by the third program pulse PGMPc of FIG. 16. However, the inventive concept is not limited thereto, and the number of program states corresponding to program pulses may be variously set.

Figure 17:
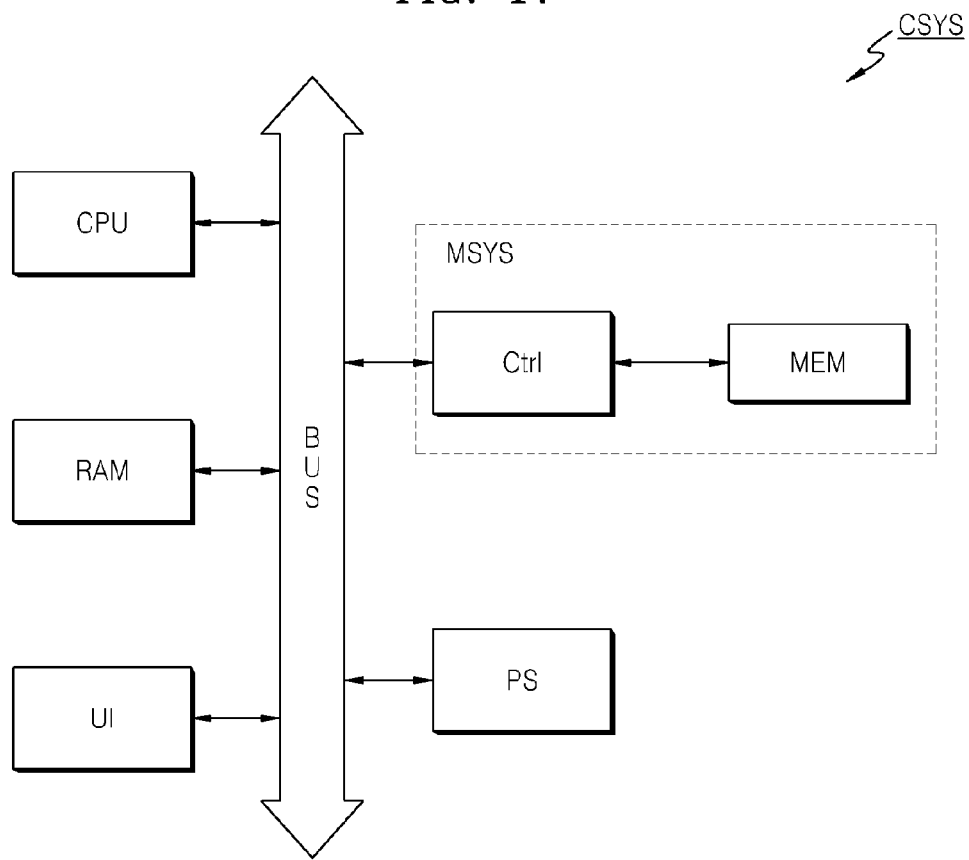
FIG. 17 is a block diagram of a computing system, according to an embodiment of the inventive concept.

FIG. 17 is a block diagram of a computing system CSYS, according to an embodiment of the inventive concept.

The computing system CSYS includes a processor CPU, a user interface UI, and a semiconductor memory system MSYS, which are electrically connected to a bus BUS. The semiconductor memory system MSYS includes a memory controller Ctrl and a memory device MEM. N-bit data (N being an integer equal to 1) processed or to be processed by the processor CPU may be stored in the memory device MEM through the memory controller Ctrl. The memory device MEM included in the semiconductor memory system MSYS of FIG. 17 may store the N-bit data by performing the foregoing programming methods, including the programming method of FIG. 1, or the like, under control of the memory controller Ctrl. Thus, power consumption of the computing system CSYS of FIG. 17 due to programming the memory device MEM is reduced.

The computing system CSYS may further include a power supplying device PS. Also, when the memory device MEM is a flash memory device, the computing system CSYS may further include a volatile memory device, such as random access memory (RAM).

When the computing system CSYS is a mobile device, a battery and a modem, such as a baseband chipset for supplying an operating voltage to the computing system CSYS, may be further included. Also, as would be apparent to one of ordinary skill in the art, an application chipset, a camera image processor (CIP), a mobile dynamic random access memory (DRAM), or the like may be further included in the computing system CSYS, although details thereof will be omitted.

Figure 18:
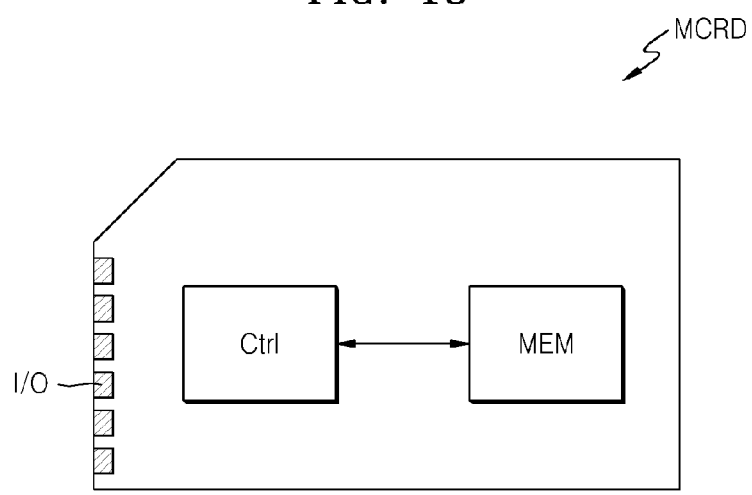
FIG. 18 is a block diagram of a memory card, according to an embodiment of the inventive concept.

FIG. 18 is a block diagram of a memory card MCRD, according to an embodiment of the inventive concept.

Referring to FIG. 18, the memory card MCRD includes a memory controller Ctrl and a memory device MEM. The memory controller Ctrl controls writing data to or reading data from the memory device MEM in response to a request from an external host (not shown) received via input/output (I/O) unit. When the memory device MEM of FIG. 18 is a flash memory device, for example, the memory controller Ctrl controls an erasing operation performed on the memory device MEM. In order to perform such control operations, the memory controller Ctrl of the memory card MCRD may include interface units (not shown) respectively interfacing with the external host and the memory device MEM, and RAM. The memory device MEM of the memory card MCRD may be a flash memory device for performing the programming method of FIG. 1 or the like. Accordingly, the reliability of a data program and reading of the memory card MCRD may be improved.

The memory card MCRD may be a compact flash card (CFC), a microdrive, a smart media card (SMC), a multimedia card (MMC), a security digital card (SDC), a memory stick, or a universal serial bus (USB) flash memory, for example.

Figure 19:
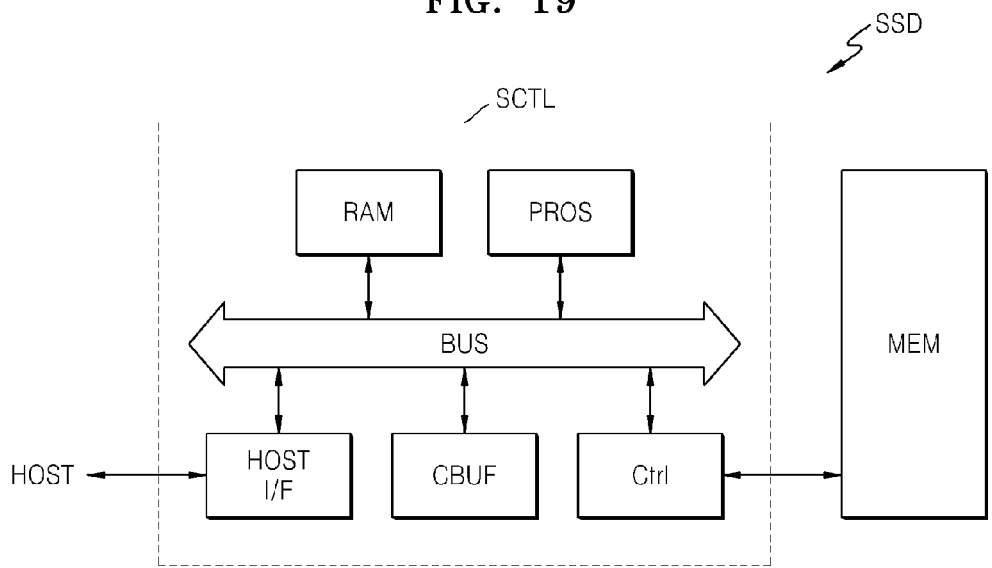
FIG. 19 is a block diagram of a solid state drive (SSD), according to an embodiment of the inventive concept.

FIG. 19 is a block diagram of a solid state drive (SSD), according to an embodiment of the inventive concept.

Referring to FIG. 19, the SSD includes an SSD controller SCTL and a memory device MEM. The SSD controller SCTL includes a processor PROS, RAM, a cache buffer CBUF, and a memory controller Ctrl, which are connected to a bus BUS. The processor PROS controls the memory controller Ctrl to receive or transmit data from or to the memory device MEM in response to a request (command, address, or data) of a host (not shown). The processor PROS and the memory controller Ctrl of the SSD may be realized as one ARM processor, for example. Data required for operations of the processor PROS may be loaded on the RAM.

The host interface HOST I/F may transmit data to the processor PROS or transmit data to the host from the memory device MEM in response to a request from the host. The host interface HOST I/F may interface with the host using one of various interface protocols, such as USB, man machine communication (MMC), peripheral component interconnect-express (PCI-E), serial advanced technology attachment (SATA), parallel advanced technology attachment (PATA), small computer system interface (SCSI), enhanced small device interface (ESDI), and intelligent drive electronics (IDE). Data to be transmitted to the memory device MEM or received from the memory device MEM may be temporarily stored in the cache buffer CBUF. The cache buffer CBUF may be a static random access memory (SRAM), for example.

The memory device MEM included in the SSD may be a memory device performing the programming method of FIG. 1 or the like. Thus, according to the SSD of FIG. 19, reliability of data programming and/or reading may be improved.

Figure 20:
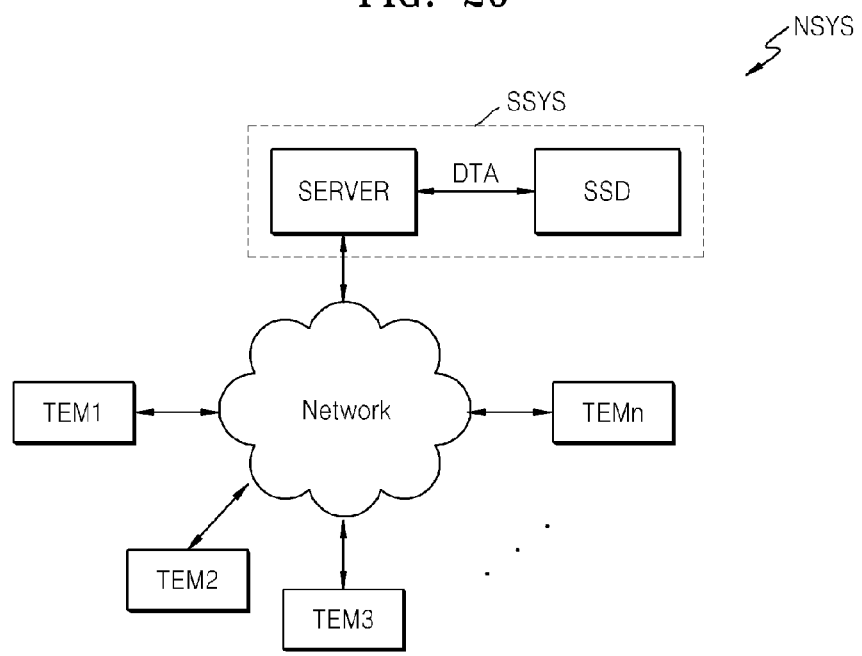
FIG. 20 is a block diagram of server system including the SSD of FIG. 19 and a network system including the server system, according to an embodiment of the incentive concept.

FIG. 20 is a block diagram of a server system SSYS including the SSD of FIG. 19 and a network system NSYS including the server system SSYS, according to an embodiment of the inventive concept.

Referring to FIG. 20, the network system NSYS may include the server system SSYS and multiple terminals TEM1 through TEMn, which are connected via a network Network. The server system SSYS includes a server SERVER for processing requests received from the terminals TEM1 through TEMn connected to the Network, and an SSD storing data corresponding to the requests of the terminals TEM1 through TEMn. The SSD of FIG. 20 may be the SSD of FIG. 19, for example. In other words, the SSD of FIG. 20 may include the SSD controller SCTL and the memory device MEM, and the memory device MEM may be a flash memory device performing the programming method of FIG. 1 or the like. Thus, according to the server system SSYS and the network system NSYS of FIG. 20, reliability of data programming and/or reading may be improved.

For example, in order to perform bit-line forcing optimized for a memory device, for example, when a margin required between program states is changed, a verification voltage for selecting a memory cell to be bit-line forced may be changed to a voltage level different from that of the verification voltage VVER1$b$ of FIG. 12 to reflect the change in margin.

According embodiments of a nonvolatile memory device and programming methods of the same, reliability of the nonvolatile memory device may be improved.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A programming method of a multi-level cell flash memory device, the programming method comprising:
programming a first memory cell of the multi-level cell flash memory device to one of first through i-th program states, wherein i is a positive integer, by applying a first program pulse to the first memory cell in a first type programming operation; and
programming a second memory cell to one of i+1-th through j-th program states, wherein j is an integer equal to or greater than three, by applying a second program pulse to the second memory cell in a second type programming operation,
wherein at least one of a second step voltage, a second bit-line forcing voltage and a second verification operation of the second type programming operation is different from a first step voltage, a first bit-line forcing voltage, and a first verification operation of the first type programming operation, respectively.

2. The programming method of claim 1, wherein the first program pulse and the second program pulse are applied in a plurality of program loops.

3. The programming method of claim 2, wherein the first type programming operation comprises sequentially increasing the first program pulse by the first step voltage in the program loops, and the second type programming operation comprises sequentially increasing the second program pulse by the second step voltage, different from the first step voltage, in the program loops.

4. The programming method of claim 3, wherein when j is three, the first program pulse is for programming the first memory cell to a first program state, and the second program pulse is a for programming the second memory cell to a second program state or a third program state.

5. The programming method of claim 4, wherein the first step voltage is smaller than the second step voltage, and a width of distribution of the first program state is narrower than a width of distribution of the second program state or the third program state.

6. The programming method of claim 4, wherein the second step voltage is smaller than the first step voltage, and a width of distribution of the first program state is wider than a width of distribution of the second program state or a maximum threshold voltage and a width of distribution of the third program state.

7. The programming method of claim 3, wherein when j is three, the first program pulse is for programming the first memory cell to a first program state or a second program state, and the second program pulse is for programming the second memory cell to a third program state.

8. The programming method of claim 7, wherein the first step voltage is smaller than the second step voltage, and a width of distribution of the first program state or the second program state is narrower than a width of distribution of the third program state.

9. The programming method of claim 7, wherein the second step voltage is smaller than the first step voltage, and a width of distribution of the first program state or the second program state is wider than a width of distribution of the third program state.

10. The programming method of claim 1, wherein the first type programming operation comprises applying the first bit-line forcing voltage to a bit line connected to the first memory cell to be programmed by the first program pulse, and
wherein the second type programming operation comprises applying the second bit-line forcing voltage, different from the first bit-line forcing voltage, to a bit line connected to the second memory cell to be programmed by the second program pulse.

11. The programming method of claim 10, wherein when j is three, the first program pulse is for programming the first memory cell to a first program state, the second program pulse is for programming the second memory cell to a second program state or a third program state, and the first bit-line forcing voltage is lower than the second bit-line forcing voltage.

12. The programming method of claim 11, wherein the second bit-line forcing voltage is applied to all bit lines with respect to the second program state.

13. The programming method of claim 10, wherein when j is three, the first program pulse is for programming the first memory cell to a first program state or a second program state, the second program pulse is for programming the second memory cell to a third program state, and the first bit-line forcing voltage is higher than the second bit-line forcing voltage.

14. The programming method of claim 10, wherein the first memory cell to be bit-line forced using two verification operations is set with respect to a programming operation according to the first program pulse, the second memory cell to be bit-line forced using two verification operations is set with respect to a programming operation according to the second program pulse, and a difference between verification voltages used in the two verification operations with respect to the programming operation according to the first program pulse is different from a difference between verification voltages used in the two verification operations with respect to the programming operation according to the second program pulse.

15. The programming method of claim 14, wherein the verification voltages with respect to the first program pulse or the verification voltages with respect to the second program pulse are changed based on a margin required between the program states.

16. A programming method of a multi-level cell flash memory device, the programming method comprising:
    programming a plurality of first memory cells to a first program state by applying a first program pulse to the plurality of first memory cells via a word line in a first type programming operation; and
    programming a plurality of second memory cells to one of a second memory state or a third memory state by applying a second program pulse to the plurality of second memory cells via the word line in a second type programming operation,
    wherein a width of distribution of the first program state varies from at least one of widths of distribution of the second and third program states, according to the first and second type programming operations.

17. The programming method of claim 16, wherein the plurality of first memory cells have least significant bits in an erase state, and the plurality of second memory cells have least significant bits in a program state.

18. A semiconductor memory system, comprising:
    a flash memory device comprising a plurality of multi-level memory cells connected to a word line; and
    a memory controller, configured to control storage of data in the plurality of multi-level memory cells by applying a first program pulse to at least one first memory cell of the plurality of multi-level memory cells in a first type programming operation for programming the at least one first memory cell to a first program state, and by applying a second program pulse to at least one second memory cell of the plurality of multi-level memory cells in a second type programming operation for programming the at least one second memory cell to one of a second program state or a third program state,
    wherein at least one of a second step voltage, a second bit-line forcing voltage and a second verification operation of the second type programming operation is different from a first step voltage, a first bit-line forcing voltage, and a first verification operation of the first type programming operation, respectively.

19. The semiconductor memory system of claim 18, wherein the first type programming operation comprises sequentially increasing the first program pulse by the first step voltage in a plurality of program loops, and the second type programming operation comprises sequentially increasing the second program pulse by the second step voltage, different from the first step voltage, in the plurality of program loops.

20. The semiconductor memory system of claim 19, wherein a width of distribution of the first program state is narrower than a width of distribution of each of the second program state or the third program state.

* * * * *